(12) United States Patent
Wilkerson et al.

(10) Patent No.: US 11,171,177 B2
(45) Date of Patent: Nov. 9, 2021

(54) PHASE CHANGE MEMORY DEVICES WITH ENHANCED VIAS

(71) Applicant: Intel Corporation, Santa Clara, CA (US)

(72) Inventors: Nathan A. Wilkerson, Boise, ID (US); Mihir Bohra, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/243,971

(22) Filed: Jan. 9, 2019

(65) Prior Publication Data

US 2019/0165046 A1 May 30, 2019

(51) Int. Cl.
*H01L 27/24* (2006.01)
*H01L 45/00* (2006.01)
(Continued)

(52) U.S. Cl.
CPC .... *H01L 27/2463* (2013.01); *H01L 21/76802* (2013.01); *H01L 21/76877* (2013.01); *H01L 23/528* (2013.01); *H01L 23/5226* (2013.01); *H01L 27/2409* (2013.01); *H01L 27/2481* (2013.01); *H01L 45/06* (2013.01); *H01L 45/1226* (2013.01); *H01L 45/1233* (2013.01); *H01L 45/1253* (2013.01); *H01L 45/144* (2013.01); *H01L 45/1608* (2013.01); *H01L 45/1675* (2013.01)

(58) Field of Classification Search
CPC . H01L 45/1233; H01L 45/06; H01L 27/2463; H01L 27/2481; H01L 27/2409; H01L 45/146; H01L 45/144; H01L 45/1675; H01L 45/04; H01L 45/1253; H01L 45/16; H01L 45/126; H01L 45/1226; H01L 23/528; H01L 21/76802; H01L 45/1608; H01L 21/76877; H01L 23/5226; G11C 2213/71; G11C 13/0004; G11C 13/0007
USPC ..... 257/2, 4, 5, E21.004, E45.001, E45.002; 438/104, 382
See application file for complete search history.

(56) References Cited

U.S. PATENT DOCUMENTS

2002/0098686 A1* 7/2002 Kobayashi ........ H01L 21/76802
438/639
2007/0217254 A1* 9/2007 Matsuoka .......... G11C 13/0004
365/163

(Continued)

Primary Examiner — David Chen
(74) Attorney, Agent, or Firm — Alliance IP, LLC

(57) ABSTRACT

A memory device includes a plurality of memory cells, a first nonconductive separator material separating the memory cells and having a word line end and bit line end, a metal via separated from the plurality of memory cells by a second nonconductive separator material, and metal bit line electrically connecting the metal via with the plurality of memory cells. The memory cells include a phase change material layer, a first electrode layer adjacent to the phase change material layer and having a phase change material layer side oriented toward the phase change material layer and a bit line side opposite the phase change material layer side, a metal silicon nitride layer on a surface of the bit line side of the first electrode layer. A bit line end surface of the first nonconductive separator material is at least partially free of contact with the metal silicon nitride layer.

14 Claims, 10 Drawing Sheets

(51) Int. Cl.
    *H01L 23/528*     (2006.01)
    *H01L 21/768*     (2006.01)
    *H01L 23/522*     (2006.01)

(56) References Cited

U.S. PATENT DOCUMENTS

| | | | |
|---|---|---|---|
| 2007/0284622 A1* | 12/2007 | Ryoo | H01L 45/06 257/213 |
| 2008/0068879 A1* | 3/2008 | Ahn | H01L 27/2463 365/163 |
| 2008/0075844 A1 | 3/2008 | Ha et al. | |
| 2008/0248632 A1* | 10/2008 | Youn | H01L 45/1233 438/483 |
| 2009/0101882 A1 | 4/2009 | Chen et al. | |
| 2009/0258477 A1 | 10/2009 | Ryoo et al. | |
| 2010/0176362 A1* | 7/2010 | Lung | G11C 13/0004 257/2 |
| 2011/0020998 A1 | 1/2011 | Oh et al. | |
| 2011/0210302 A1* | 9/2011 | Tsukada | H01L 27/2445 257/2 |
| 2012/0112153 A1* | 5/2012 | Ninomiya | H01L 45/1625 257/2 |
| 2016/0233271 A1* | 8/2016 | Pellizzer | H01L 45/1608 |
| 2018/0337186 A1* | 11/2018 | Chang | H01L 27/10885 |
| 2019/0140022 A1* | 5/2019 | Jeong | H01L 45/04 |
| 2020/0111957 A1* | 4/2020 | Kim | H01L 45/1616 |

\* cited by examiner

PHASE CHANGE MEMORY DEVICES WITH ENHANCED VIAS

BACKGROUND

Phase change materials have properties that invite their use in a number of applications such as ovonic threshold switches and phase change memory (PCM). Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store information. Each state is designated a different informational value, and once stored, the information can be read by detecting the electrical resistance of the material. The fact that each state persists once fixed makes PCM a valuable non-volatile memory (NVM) type.

DESCRIPTION OF EMBODIMENTS

Figure 1:
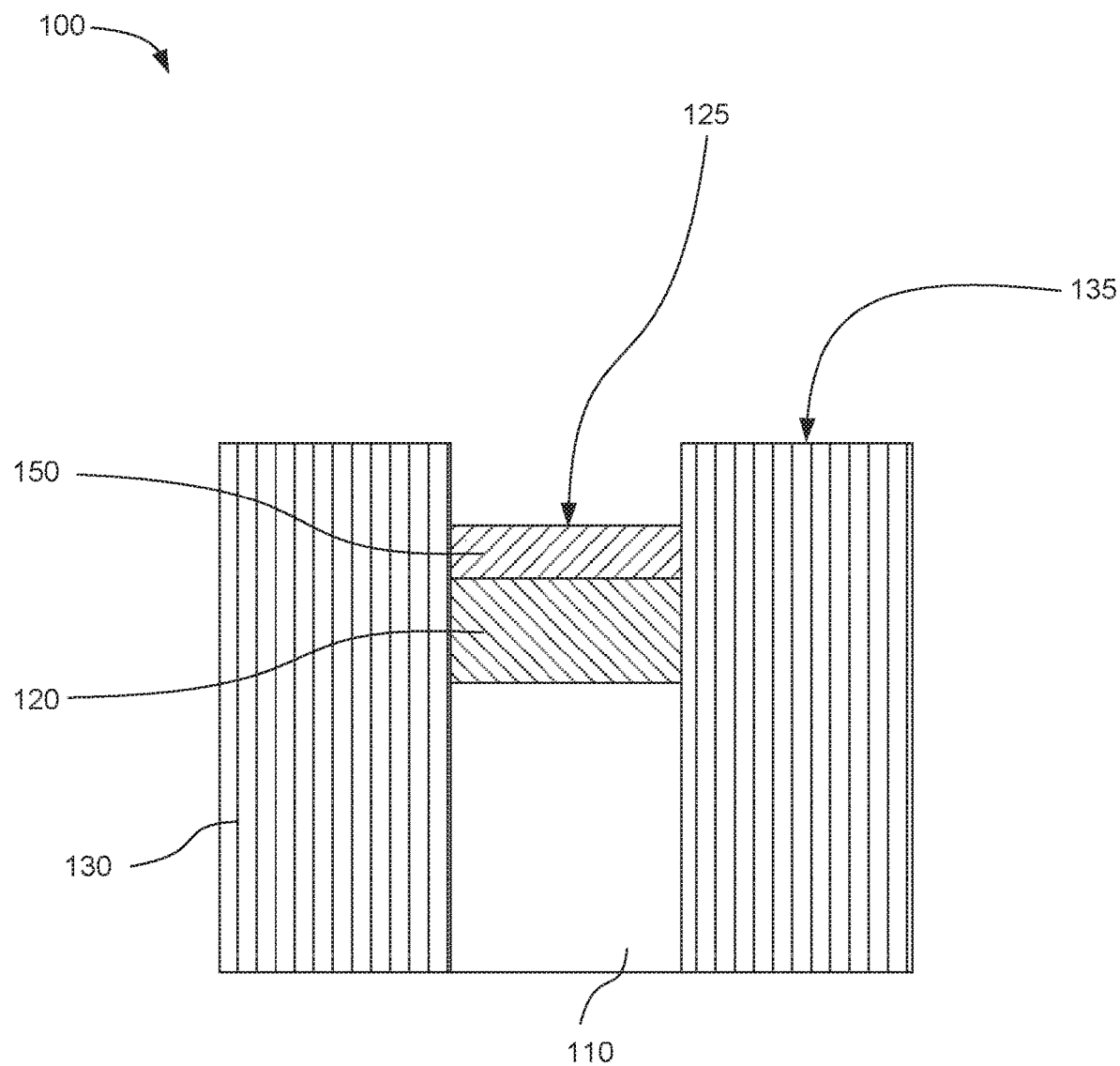
FIG. 1 is a cross-sectional view of an example memory cell in accordance with an example embodiment.

Although the following detailed description contains many specifics for the purpose of illustration, a person of ordinary skill in the art will appreciate that many variations and alterations to the following details can be made and are considered included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

In this application, "comprises," "comprising," "containing" and "having" and the like can have the meaning ascribed to them in U.S. Patent law and can mean "includes," "including," and the like, and are generally interpreted to be open ended terms. The terms to "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, comparative terms such as "increased," "decreased," "better," "worse," "higher," "lower," "enhanced," "maximized," "minimized," or "improved," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device that is more likely to have write errors to it than other regions in the same memory device. A number of factors can cause such increased risk, including location, fabrication process, number of program pulses applied to the region, etc.

The term "coupled," as used herein, is defined as directly or indirectly connected in an electrical or nonelectrical manner. "Directly coupled" structures or elements are in physical contact with one another and are attached. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific technology embodiments are then described in further detail. This initial summary is intended to aid readers in understanding the technology more quickly, but is not intended to identify key or essential technological features, nor is it intended to limit the scope of the claimed subject matter.

Phase change memory arrays have been developed to include many memory cells connected to bit lines and word lines. In some cases, each phase change memory cell is made up of a number of layers of different materials. One of the layers is typically a phase change material (e.g. a chalcogenide material), while other layers can include electrodes, select device materials, diffusion barrier materials, thermal insulating materials, and so on. In some cases, individual memory cells can be separated by dielectric materials to electrically insulate the memory cells from one another. Bit lines and word lines of metal are deposited along columns and rows of memory cells to allow the memory cells to be addressable. Additional structures can be incorporated into memory arrays such as conductive vias that penetrate through the substrate on which the memory array is formed to allow electrically conductive access there through.

The various material layers and structures that make up a phase change memory array can present various manufacturing challenges. It is often desirable to make memory structures as small as possible in order to make high-density memory. However, this is balanced against processing limitations and the need for consistent and reliable memory operation. In certain types of phase change memory, the memory cells can include at least a phase change material layer and a first electrode layer adjacent to the phase change material layer. A metal bit line can be deposited over a column of memory cells, but first a metal silicon nitride layer can be deposited between the electrode layer and the metal bit line. In some cases, the metal silicon nitride layer can enhance the operation of the phase change memory cells by benefitting the reset current of the memory cells.

One process for manufacturing phase change memory can include the following steps. First, continuous layers of phase change material and first electrode material can be deposited. Then these layers can be divided into individual memory cells separated by dielectric material, or alternatively the layers can be divided into multiple lines separated by dielectric material that can subsequently be cut into individual memory cells. A layer of metal silicon nitride can then be deposited over the first electrodes and the dielectric material. A metal bit line can be deposited over the metal silicon nitride layer. This results in a memory structure having a continuous layer of metal silicon nitride that extends along the dielectric material and first electrodes of a column of memory cells.

It has been found that the process described above results in several disadvantages, both in the quality of the phase change memory array as a final product and in the ease of manufacturing the phase change memory array. Layers of the various materials can be deposited by methods such as chemical vapor deposition (CVD), physical vapor deposition (PVD) spin coating/spin-on deposition (SOD), electron beam evaporation, and others. In some cases the layers can be patterned using methods such as lithography techniques including wet etch, dry etch, and other patterning methods. In some cases, a temporary layer such as a mask or a protective cap can be deposited and then subsequently removed by a polishing operation, such as chemical mechanical polishing (CMP).

In the phase change memory manufacturing method described above, a vertical conductive via is typically added either before or after the memory cells are divided and separated by dielectric material. The conductive via is formed from a metal such as tungsten. A temporary nitride layer is deposited over the memory cells while forming the via. After the via is formed, the nitride layer is removed by a chemical mechanical polishing operation. A metal silicon nitride layer is then deposited over the first electrodes of the memory cells and the dielectric material between the cells. The metal silicon nitride layer is also deposited over the via. A metal bit line is then deposited over the metal silicon nitride layer.

One disadvantage of this process is related to performing a chemical mechanical polishing operation that stops at the surface of the first electrodes of the memory cells. In some cases, the first electrodes are made of a relatively soft material, such as a carbon-based material. The chemical mechanical processing operation can wear away some of the first electrode material. In some cases, the first electrodes can wear away more in certain locations than at others, such as wearing more near the edges and less near the center, resulting in non-uniformity that can negatively affect subsequent processes such as subsequent etch operations. This non-uniformity can change etch profiles and cause, for example, under-etching, over-etching, or more lateral etch than desired. This can potentially expose the cell stack. This can negatively impact cell yield, and in some cases, can result in cross-contamination of select device materials and phase change materials.

The chemical mechanical processing operation can also cause "dishing," or in other words having a curved depression in the surface of the dielectric material. This dishing can negatively affect the operation of the memory cell. In some cases, the memory cell can be rendered inoperable, which negatively affects cell yield.

Additionally, the process described above results in a metal silicon nitride layer between the bit line and the via. In some cases the via and the bit line are made of the same metal, such as tungsten. Including a metal silicon nitride layer, such as tungsten silicon nitride, between the bit line and the via can increase electrical resistance between the bit line and the via compared to a direct metal-to-metal contact between the bit line and the via. However, it is often desirable to include the metal silicon nitride layer to connect the first electrodes to the bit line as mentioned above. The process also results in a via that protrudes toward the bit line. Thus, when the metal silicon nitride layer and the bit line are deposited, they must wrap around the protruding via. The deposition of the metal silicon nitride layer further adds to the via protrusion. In some cases the via protrudes to the point that the bit line deposited over the via can break in the vicinity of the via.

In one example, the present technology provides new processes for manufacturing phase change memory structures. These new processes can solve one or more of the problems described above. In one example, a phase change memory structure can be made with a column of memory cells electrically connected by a bit line and a vertical via also connected to the bit line. In this process, a continuous metal silicon nitride layer can be deposited at the beginning of the process before the memory cells are divided. For example, a stack of layers of material can be deposited, including a continuous layer of phase change material and a continuous layer of first electrode material. A continuous layer of metal silicon nitride can be deposited over the first electrode material at this stage. Additionally, a partial metal layer can be deposited over the metal silicon nitride layer. This layer is referred to as a "partial" layer because additional metal can be deposited later to form a metal bit line. The partial layer can also be thinner than a full metal layer deposited to form the metal bit line.

After the continuous layers of phase change memory materials are deposited (including the metal silicon nitride layer and partial metal layer), the layers can be divided into individual memory cells, or alternatively into multiple lines that can subsequently be cut into individual memory cells, and vias can be formed as described above. However, adding the metal silicon nitride layer and partial metal layer in the early stages of the process can produce several advantages. First, a temporary protective nitride layer can be deposited over the memory cells during formation of the vias as described above. The temporary nitride layer can be removed by CMP. However, in the new process the CMP operation can stop on the partial metal layer instead of on the first electrode layer. The partial metal layer is typically harder than the first electrode layer and less prone to erosion caused by the CMP operation. Thus, the partial metal layer can protect the first electrode layer so that the first electrode layer remains uniform, or substantially uniform.

Additionally, because the metal silicon nitride layer is deposited before the memory cells are divided into individual memory cells, the metal silicon nitride layer is discontinuous and does not cover the via. When the metal bit line is deposited at the end of the process, the metal bit line directly contacts the via by a metal-to-metal contact. This can have reduced resistance compared to processes in which the metal silicon nitride layer is between the metal bit line and the via.

Further, the via is less protruding in the present processes. In other processes, the via protrusion is typically greater because the temporary nitride layer is polished all the way down to the first electrode layer. By contrast, in the present processes, a metal silicon nitride layer and a partial metal layer are present over the first electrode layer. The temporary nitride layer is polished only down to the partial metal layer. Thus, the polishing proceeds a shorter distance resulting less via protrusion when the metal bit line is deposited. Consequently, the surface of the bit line is much more uniform.

Making memory devices using the new processes described herein results in memory devices having a unique structure. First, the partial metal layer can be made of the same metal as the metal bit line that is deposited over the partial metal layer at the end of the process. Thus, the partial metal layer together with the metal deposited to form the bit line can be considered to be a bit line having a surface that extends from a bit line end surface of the first nonconductive separator material to contact the metal silicon nitride layer of the memory cell. Thus, the bit line can have a different shape than the bit line formed using the previous process. Additionally, the metal silicon nitride layer can be discontinuous, as opposed to the continuous metal silicon nitride layer provided by other processes. The metal silicon nitride layer also is not present between the first nonconductive separator material and the bit line or between the via and the bit line, unlike the metal silicon nitride layer provided by other processes. The present processes can also provide first electrode layers that have a more uniform upper surface. No erosion of the first electrode layers occurs because the chemical mechanical polishing process does not proceed down to the upper surface of the first electrode layers. Furthermore, the metal bit line may have a "bulge" where the bit line overlies the via. However, because the via protrudes less than in the previous process, the bulge or protrusion effect of the bit line can be smaller (e.g. minimized).

In some examples of the present disclosure, a memory cell can include several layers of different materials. For example, a memory cell can include a first electrode layer, a phase change material layer adjacent to the first electrode layer, and a second electrode layer adjacent to the phase change material layer and opposite the first electrode layer. Further, a select device material layer can be adjacent to the second electrode layer and opposite the phase change material layer. A third electrode layer can be adjacent to the select device material layer and opposite the second electrode layer. Additionally, a metal silicon nitride layer can be adjacent to the first electrode layer and opposite the phase change material layer. In further examples, a plurality of these memory cells can be included in a memory device. A metal bit line can connect a row or column of memory cells by contacting the metal silicon nitride layer of the memory cells. Metal word lines can contact the third electrode layers of the memory cells, and the word lines and bit lines can be oriented orthogonally so that individual memory cells can be addressable by selecting a particular bit line and word line.

In certain examples, the memory cells can be manufactured by depositing layers of material in sequence starting with a bottom layer and working upward. In some such processes, the memory cell can be oriented with the third electrode layer at the bottom and the metal silicon nitride layer at the top. Accordingly, in some cases the third electrode layer can be referred to as a bottom electrode layer. Similarly, the first electrode layer can in some cases be referred to as the top electrode layer. The second electrode layer can also be referred to as the middle electrode layer. It is understood that the memory devices described herein can be oriented in a variety of orientations and that the "top electrode" may not literally be at the top of the device in all circumstances. However, for convenience these terms can be used to describe the various layers and parts of the memory cells and memory devices. Additionally, terms denoting locations and directions such as "above," "below," "down", "downward," "up," "upward," "higher," "lower," and so on can be interpreted consistent with the top and bottom of the memory cells as described above. Further, because a metal bit line is deposited in contact with the metal silicon nitride layer at the "top" of the memory cells, in some cases the terms "bit line side" or "bit line end" can refer to a surface of a layer that is closest to the bit line. The direction "up" or "upward" can also be referred to as "bit line oriented" or "bit line end direction." The word lines can be located opposite from the bit lines, in contact with the third, or "bottom," electrode layers. Therefore, the terms "word line side," "word line end," "word line oriented," and "word line end direction" can be used to refer to surfaces closest to the word line, the direction toward the word line, or in other words the "downward" direction or "bottom" surfaces.

With the foregoing in mind, FIG. 1 shows a cross-sectional view of an example memory cell 100 according to the present technology. This memory cell includes a phase change material layer 110 and a first electrode layer 120 adjacent to the phase change material layer and having a phase change side oriented toward the phase change material layer and a bit line side opposite the phase change material layer side. A nonconductive separator material 130 is located on sides of the phase change material layer. The nonconductive separator material can be a dielectric material in some examples. The nonconductive separator material may extend in a bit line end direction past the first electrode. As used herein, "bit line end" refers to the end of the nonconductive separator material that is closest to or in contact with the bit line when the bit line is deposited. Similarly, the "word line end" is the opposite end of the nonconductive separator material that is closest to the word line. This nonconductive separator material can insulate the memory cell from other memory cells. The memory cell can also include a metal silicon nitride layer 150 in contact with the bit line side of the first electrode layer. The nonconductive separator material can have a bit line end surface 135 that protrudes farther in the bit line end direction than the bit line end surface 125 of the memory cell. In some examples, the bit line end surface of the memory cell can be the surface of the first electrode layer or the surface of the metal silicon nitride layer, if present. It should be noted that the bit line end surface of the nonconductive separator material being higher than the bit line end surface of the memory cell is different from the structure provided by other processes, because in such processes the bit line end surface of the nonconductive separator material is coplanar with the bit line end surface of the first electrode of the memory cell.

In some examples, the metal element included in the metal silicon nitride layer can be tungsten. Thus, the metal silicon nitride layer can include tungsten silicon nitride (WSiN) in certain examples. A variety of other metals can also be used in the memory cells. In certain specific examples, the metal can be tungsten, tantalum, niobium, molybdenum, titanium, or a combination thereof. In further examples, the metal element in the metal silicon nitride layer can consist of one of these metals.

In other specific examples, the metal silicon nitride layer can include or consist of tungsten silicon nitride, tantalum silicon nitride, niobium silicon nitride, molybdenum silicon nitride, titanium silicon nitride, or a combination thereof.

As used herein, "metal silicon nitride" describes materials formed of a metal, silicon, and nitride. This term does not limit the material to any specific stoichiometric proportions of metal, silicon, and nitrogen atoms in the material. Acronyms used to describe specific materials herein, such as "WSiN," are not intended to limit the material to any particular stoichiometric ratios of the atoms in the material. In some examples, the concentration of nitrogen in the metal silicon nitride can be from about 1 at % to about 50 at %. In further examples, the concentration of silicon in the metal silicon nitride can be from about 1 at % to about 20 at %. The concentration of the metal in the metal silicon nitride can be from about 30 at % to about 95 at % in various examples.

The thicknesses of the layers are not particularly limited. However, in some examples the metal silicon nitride layer can have a thickness of 10 Å to 300 Å. In further examples, the metal silicon nitride layer can have a thickness of 20 Å to 100 Å. In a particular example, the metal silicon nitride layer can be about 50 Å thick. In other examples, the first electrode layer can have a thickness of 10 Å to 500 Å. In further examples, the first electrode layer can have a thickness of 20 Å to 200 Å. It should be noted that the layer thicknesses, lengths, and widths shown in the figures are not necessarily drawn to scale.

In some examples, the first electrode can have a surface that is substantially flat. This is a significant improvement over other processes, which can result in erosion of the first electrodes. In some examples, the substantially flat first electrode can have a height variation of 10 Å or less, 5 Å or less, or even 2 Å or less.

In certain examples, the memory cells described herein can include additional layers not shown in FIG. 1. These additional layers can include, but are not limited to, additional electrode layers, diffusion barrier layers, select device material layers, conductive word line layers, and so on. In a particular example, the memory cell can include a second electrode layer adjacent to the phase change material layer opposite the first electrode layer, a select device layer adjacent to the second electrode layer opposite the phase change material layer, and a third electrode layer adjacent to the select device layer opposite the second electrode layer.

As a general matter, the phase change material can include any useful material having a stable and detectable change in phase. Examples of such a materials include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., $Ge_XSb_YTe_Z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient.

It is noted that the select device material can generally be made of a phase change material, and as such, the above exemplary chalcogenide materials are applicable to select device material layers as well. The actual chalcogenide material used in a given memory cell for the phase change material layer and the select device material layer can be different or the same, depending on the design of the device. In another example, the select device material can be a conductor, semiconductor, or dielectric material. Such materials can be selected as needed to perform an intended function in the memory cell.

The first electrode layer and/or other electrode layers in the memory cell can be formed of conductive materials. In some examples, the electrode layers can include carbon-containing materials. Specific, non-limiting examples of electrode materials can include amorphous carbon, amorphous carbon doped with silicon, and silicon carbide doped with tungsten.

The memory cell can include a nonconductive separator material contacting a side of the phase change material layer. In various examples, the nonconductive separator material may contact one side, two sides, three sides, four sides, etc. of the phase change material layer. The nonconductive separator material can also extend to contact other layers in the memory cell, such as the electrode layers, the metal silicon nitride layer, the select device material layer, and so on. Generally, the nonconductive separator material can insulate the memory cell from other adjacent memory cells. In certain examples, memory cells can be insulated one from another by a combination of nonconductive separator material and air gaps or other materials.

In some examples, the bit line end surface of the nonconductive separator material can protrude in the bit line end direction farther than the surface of the first electrode layer. In further examples, the bit line end surface of the nonconductive separator material can protrude in the bit line end direction farther than the surface of the metal silicon nitride layer. In a particular example, the distance in the bit line end direction between the bit line end surface of the nonconductive separator material and the surface of the metal silicon nitride layer can be from about 10 Å to about 500 Å.

In some examples, the nonconductive separator material can be a spin-on dielectric material. In a particular example, the nonconductive separator material can be a silicon dioxide dielectric material. In another particular example, the nonconductive separator material can include or be formed from tetraethyl orthosilicate (TEOS).

The bit line end surface of the nonconductive separator material can be at least partially (or even completely) free of contact with the metal silicon nitride layer. In certain examples, the memory cell can be formed by depositing continuous layers of the memory cell materials, with the top layer being the metal silicon nitride layer. The layers can then be divided into memory cells by etching to remove the layer materials between the memory cells. Thus, the metal silicon nitride is removed from between memory cells. A nonconductive separator material can then be filled in the spaces between memory cells. Therefore, the nonconductive separator material does not have metal silicon nitride deposited on the bit line end surface of the nonconductive separator material. This is different from other processes, in which a continuous layer of metal silicon nitride was deposited after the memory cells had already been divided. In some examples, the bit line end surface of the nonconductive separator material can be entirely free of metal silicon nitride. However, because some small amount metal silicon nitride may potentially overlap the bit line end surface of the nonconductive separator material (either by diffusion, contamination, or some other imperfection), in some examples, the bit line end surface of the nonconductive separator material can be substantially free of contact with the metal silicon nitride or at least partially free of contact with the metal silicon nitride.

Figure 2:
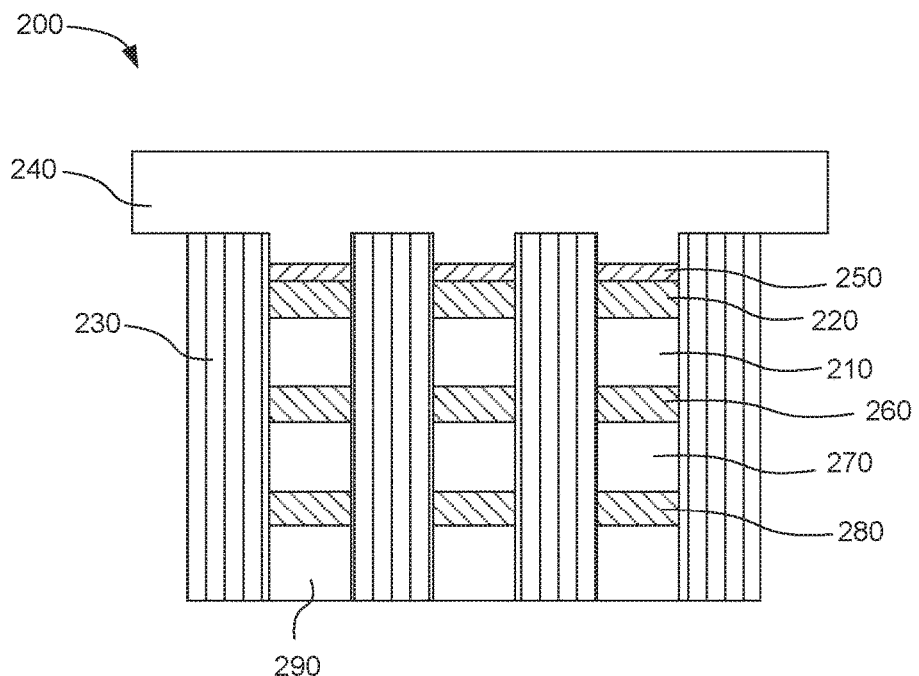
FIG. 2 is a cross-sectional view of an example memory structure in accordance with an example embodiment.

FIG. 2 shows a cross-sectional view of an example memory structure 200. The memory structure includes a plurality of memory cells comprising a phase change material layer 210 and a first electrode layer 220 adjacent to the phase change material layer. A nonconductive separator material 230 is located between the memory cells to electrically insulate the memory cells one from another. A metal silicon nitride layer 250 is deposited on a surface of the first electrode layers opposite the phase change material layers. No metal silicon nitride layer is contacting a bit line end surface of the nonconductive separator material. A metal bit line 240 has a surface that contacts the bit line end surface of the nonconductive separator material and the metal silicon nitride layer.

The example shown in FIG. 2 also includes additional layers in the memory cells. A second electrode layer 260 is located below the phase change material layer 210. A select device material layer 270 and a third electrode layer 280 are located below the second electrode 260. A word line 290 is in contact with the bottom surface of the third electrode layer.

In some examples, the metal bit line can include any of the metals listed as components of the metal silicon nitride layer. In certain examples, the bit line can include or consist of tungsten, tantalum, niobium, molybdenum, titanium, or a combination thereof. In one particular example, the bit line can be a tungsten bit line. In further examples, the word lines can include or consist of any of these metals.

It should be noted that the figures described herein show examples of memory structures and arrays to illustrate features of the present technology, and that the present technology is not limited by the number of memory cells, size of arrays, dimensions of material layers, etc., as shown in the figures. In many practical applications, phase change memory structures and systems in accordance with the present technology can have many more memory cells than are depicted in the figures. For example, phase change memory structures and systems can have millions, billions, or more memory cells compared to the relatively small number depicted in the figures.

In some examples, bit lines can be oriented along columns of memory cells and word lines can be oriented along rows of memory cells. In many embodiments described herein, the bit lines are described as being deposited on the top of the memory cells while the word lines are described as being at the bottom of the memory cells. However, in other embodiments, the word lines can be at the top of the memory cells and the bit lines can be at the bottom of the memory cells. Additionally, because designation of "rows" and "columns" of memory cells can be arbitrary, in many cases the terms "bit line" and "word line" can be interchangeable and merely describe which electrically conductive line is oriented in the row direction and which is oriented in the column direction. Thus, embodiments that are described as having bit lines on top of the memory cells can also encompass devices having word lines on the top. Similarly, embodiments described as having word lines on the bottom of the memory cells can also encompass devices having bit lines on the bottom.

Figure 3:
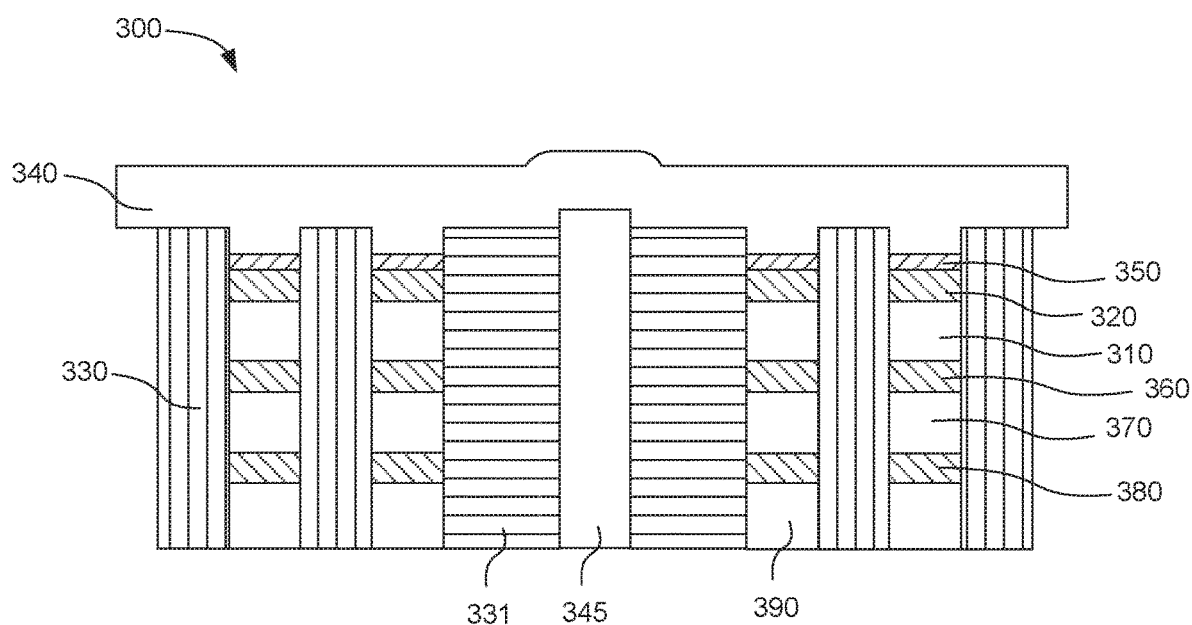
FIG. 3 is a cross-sectional view of an example memory device in accordance with an example embodiment.

FIG. 3 shows a cross-sectional view of an example memory device 300. The memory device includes a plurality of memory cells that each includes a phase change material layer 310 and a first electrode layer 320 above the phase change material layer. A metal silicon nitride layer 350 is deposited on a top surface of the first electrode layers. The memory cells are separated one from another by a first nonconductive separator material 330. A vertical via 345 is separated from the plurality of memory cells by a second nonconductive separator material 331. The vertical via can be formed of metal. A bit line 340 can be formed of the same metal, and have a surface that contacts the metal silicon nitride layer and a surface of the vertical via. No metal silicon nitride layer is deposited on the surface of the vertical via such that the bit line contacts the surface of the vertical via by a metal-to-metal contact.

In some examples, the first nonconductive separator material 330 and the second nonconductive separator material 331 can be different materials. In a particular example, the second nonconductive separator material can be tetraethyl orthosilicate and the first nonconductive separator material can be a carbon or carbon-based spin-on dielectric. In some cases, some dishing of the second separator material can occur during a chemical mechanical polishing operation. However, the presently disclosed processes allow a shorter polishing distance than previous processes, and therefore the dishing of the second separator material can be comparably less. In some examples, the second separator material can have a height variation in the bit line end direction of less than 100 Å. In further examples, the second separator material can have a height variation of less than 50 Å. As used herein, "height variation" refers to height the difference between the point on the bit line end surface of the second separator material that is farthest in the bit line end direction and the point on the bit line end surface of the second separator material that is least far in the bit line end direction.

As shown in FIG. 3, the bit line can bulge or protrude in the location where the bit line overlies the vertical via. As mentioned above, the vertical via can protrude a shorter distance compared to previous processes. This can result in a reduced or minimized amount of bulging or protrusion of the bit line over the via. In some examples, the bit line can bulge or protrude by less than 50 Å where the bit line overlies the top surface of the vertical via. In particular, the surface of the bit line opposite the memory cells and the meta via can protrude away from the metal via at a location corresponding to the via compared to a location over the memory cells. However, in some examples the protrusion distance between these locations can be less than 50 Å.

The contact between the bit line and the vertical via can also have reduced resistance compared to previous processes, because no metal silicon nitride layer is present between the bit line and the via. If the bit line and the via are made of the same metal, then the bit line and via can become a single unitary body of the metal with low resistance.

The example shown in FIG. 3 also includes additional layers in the memory cells. A second electrode layer 360 is located adjacent to the phase change material layer opposite the first electrode layer. A select device material layer 370 and a third electrode layer 380 are located adjacent to the second electrode opposite the phase change material layer. A word line 390 is in contact with the third electrode layer.

Figure 4:
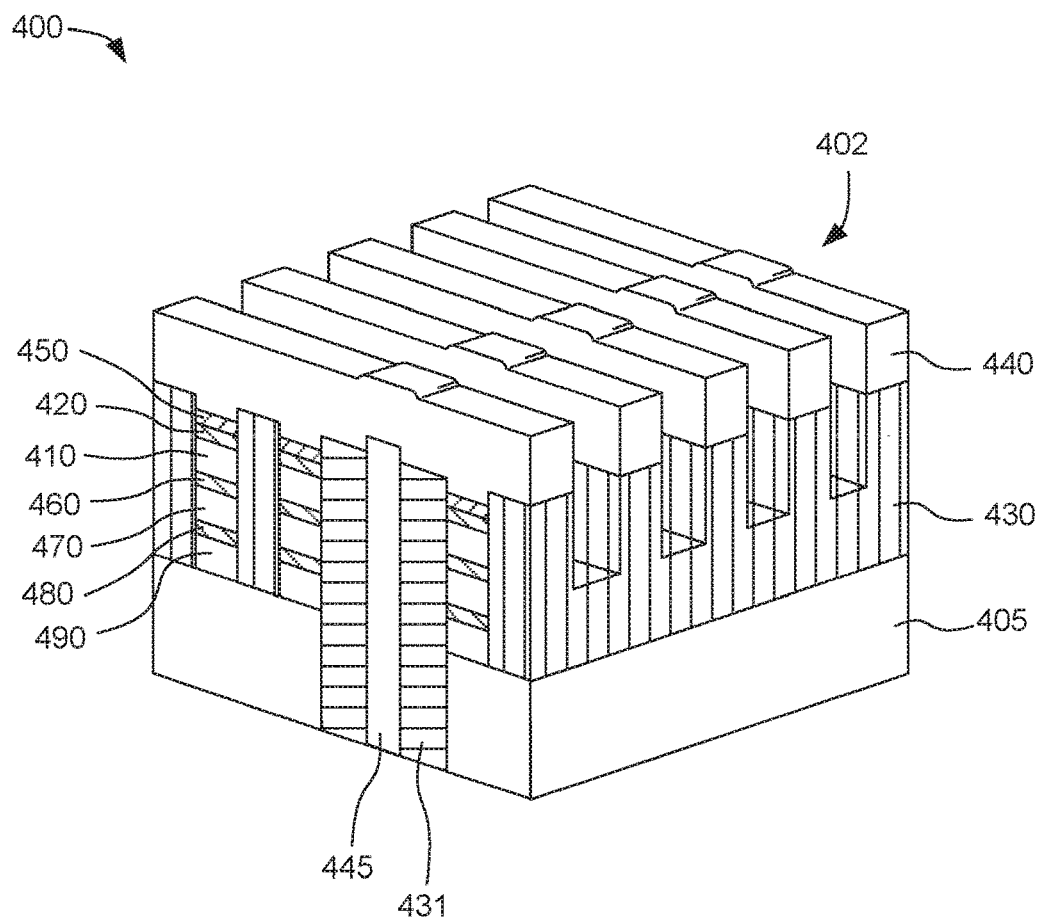
FIG. 4 is a perspective view of another example memory device in accordance with an example embodiment.

FIG. 4 shows a perspective view of another example memory device 400. The system includes an array 402 of memory cells arranged in rows and columns on a substrate 405. The memory cells include a phase change material layer 410, a first electrode layer 420 adjacent to the phase change material layer, and a metal silicon nitride layer 450 adjacent to the first electrode layer opposite the phase change material layer. A first nonconductive separator material 430 is between the memory cells to electrically insulate the memory cells one from another. The first nonconductive separator material can have a bit line end surface that is farther in the bit line end direction than a surface of the memory cell. A plurality of bit lines 440 are oriented along the columns of memory cells. The bit lines have non-flat surfaces that contact the bit line end surface of the first nonconductive separator material and protrude from the bit line end surface of the first separator material to a surface of the memory cell. In particular, the bit line extends to the surface of the metal silicon nitride layer opposite the first electrode layer. The memory cells also include a second electrode layer 460, a select device material layer 470, and a third electrode layer 480. A plurality of word lines 490 run along rows of memory cells. The word lines are in contact with the surfaces of the memory cells opposite the bit lines. The array also includes a vertical via 445 separated from the memory cells by a second nonconductive separator material 431.

Figure 5:
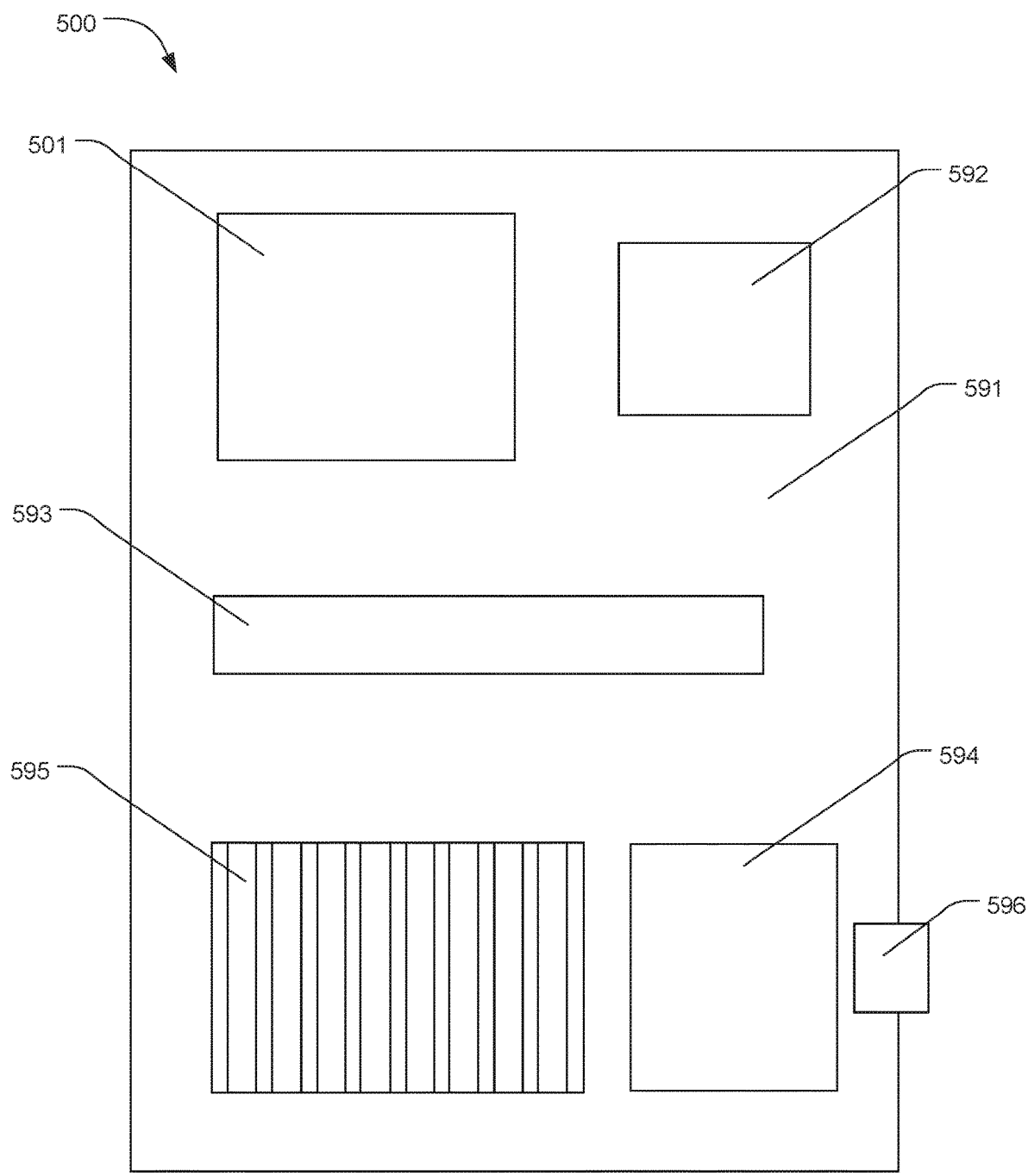
FIG. 5 is a schematic of a computing system in accordance with an example embodiment.

In some examples, a memory device as described herein can be included in a computing system. In one aspect, as illustrated in FIG. 5, a computing system 500 can include a motherboard 591 and a memory device 501 as described herein that is operably coupled to the motherboard. In some additional examples, a computing system can include a processor 592, a radio 594, a heat sink 595, a port 596, a slot 593, an additional memory device (not shown), or any other suitable device or component, which can be operably coupled to the motherboard. The computing system can comprise any type of computing system, such as a desktop computer, a laptop computer, a tablet computer, a smartphone, a wearable device, a server (e.g. a local data storage server, a cloud storage server, or the like), etc. Other embodiments need not include all of the features specified in FIG. 5, and may include alternative features not specified in FIG. 5.

Circuitry used in electronic components or devices (e.g. a die) of a memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

Figure 6:
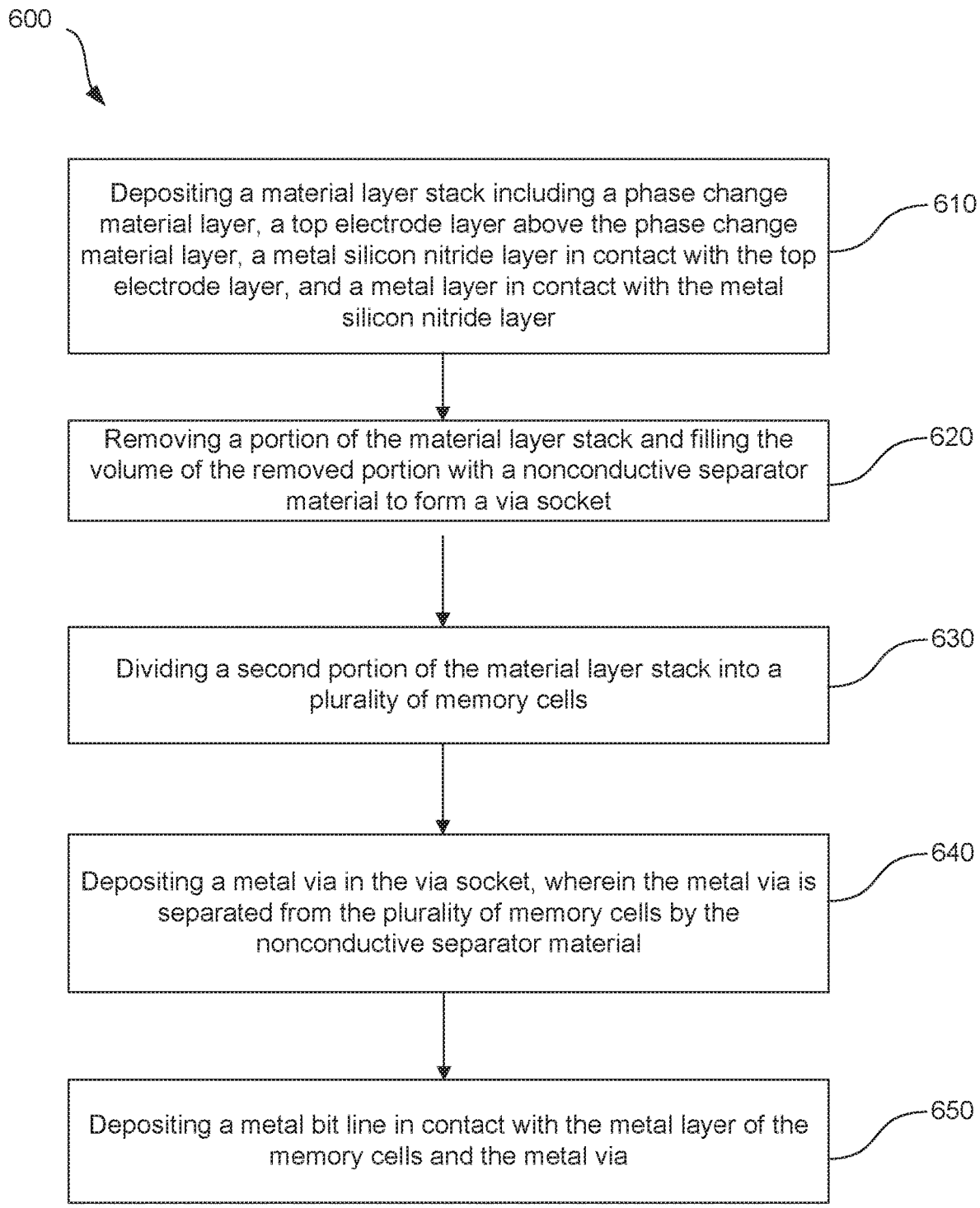
FIG. 6 is a flowchart of an example method of manufacturing a memory device in accordance with an example embodiment.

The present technology also extends to methods of making memory devices. FIG. 6 is a flow chart of an example method 600 of manufacturing a memory device. The method includes: depositing a material layer stack including a phase change material layer, a first electrode layer adjacent to the phase change material layer, a metal silicon nitride layer in contact with the first electrode layer opposite the phase change material layer, and a metal layer in contact with the metal silicon nitride layer 610 opposite the first electrode layer; removing a portion of the material layer stack and filling the volume of the removed portion with a nonconductive separator material to form a via socket 620; dividing a second portion of the material layer stack into a plurality of memory cells 630; depositing a metal via in the via socket, wherein the metal via is separated from the plurality of memory cells by the nonconductive separator material 640; and depositing a metal bit line in contact with the metal layer of the memory cells and the metal via 650.

As explained above, the memory devices described herein can be made by first depositing a stack of material layers, including a metal silicon nitride layer and partial metal layer at the top of the stack. Again, the partial metal layer is referred to as "partial" because in some examples the partial metal layer can be the same metal as the metal bit line that is deposited later. Thus, the partial metal layer can effectively become a part of the bit line. Additionally, in some examples the thickness of the partial layer can be less than the thickness of the bit line.

The thicknesses of the layers in the material layer stack are not particularly limited. However, in some examples the metal silicon nitride layer can have a thickness of 10 Å to 300 Å. In further examples, the metal silicon nitride layer can have a thickness of 20 Å to 100 Å. In a particular example, the metal silicon nitride layer can be about 50 Å thick. In other examples, the first electrode layer can have a thickness of 10 Å to 500 Å. In further examples, the first electrode layer can have a thickness of 20 Å to 200 Å. In additional examples, the partial metal layer can have a thickness of 20 Å to 500 Å. In certain examples, the partial metal layer can have a thickness of 50 Å to 300 Å. In a particular example, the partial metal layer can have a thickness of about 250 Å. In still further examples, the conductive metal bit line can have a thickness of 100 Å to 1000Å. It should be noted that the layer thicknesses, lengths, and widths shown in the figures are not necessarily drawn to scale.

In some examples, after the material layer stack is formed, the via socket can be formed by removing a portion of the layers and filling the removed volume with a nonconductive separator material. A nitride layer can then be deposited over the metal layer and the nonconductive separator material of the via socket before dividing the material layers into the plurality of memory cells. The individual memory cells can then be formed by etching portions of the layers and filling in the etched volumes with an additional nonconductive separator material. In further examples, a nitride cap layer can be deposited after dividing the material layers into the plurality of memory cells. The metal via can then be formed by etching an area of the nonconductive separator material in the via socket and then filling the etched volume with metal. The method can also include removing the nitride layers using a polishing operation adapted to stop on the metal layer of the memory cells. The metal bit line can then be deposited so that the metal layers on the memory cells become part of the bit line, and the bit line contacts the metal via by a metal-to-metal contact.

EXAMPLES

The following examples pertain to specific embodiments and point out specific features, elements, or steps that can be used or otherwise combined in achieving such embodiments.

Figure 7A:
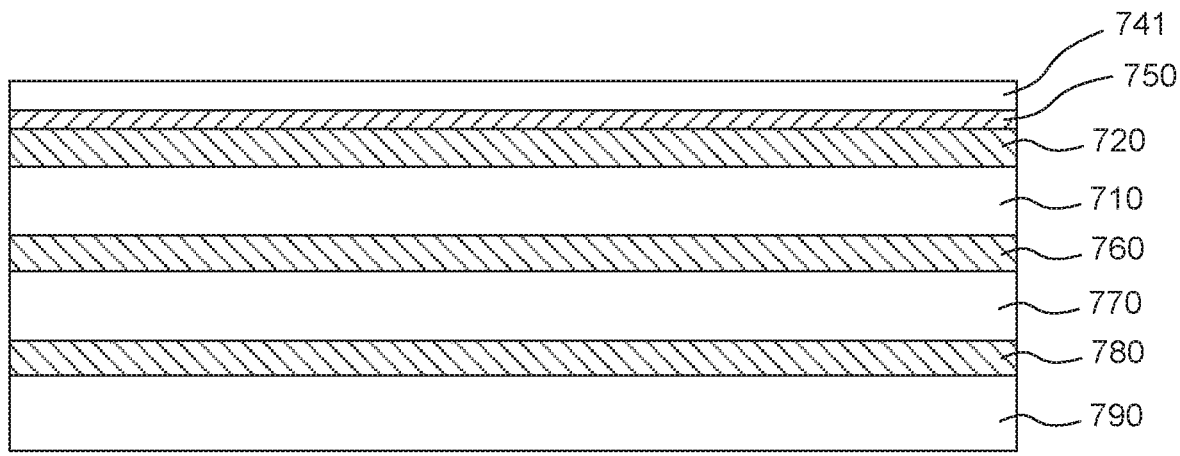
FIGS. 7A-7I are cross-sectional views of steps in a method of manufacturing a memory device in accordance with an example embodiment.

FIGS. 7A through 7I show cross-sectional views of multiple steps in a method of manufacturing a memory device in accordance with an example embodiment. In FIG. 7A, continuous layers of several materials are deposited. From bottom to top as shown in the figure, the layers include: a tungsten word line 790, a third electrode layer 780, a select device material layer 770, a second electrode layer 760, a phase change material layer 710, a first electrode material layer 720, a tungsten silicon nitride layer 750, and a partial tungsten layer 741. The electrode layers are carbon-containing electrode materials.

Figure 7B:
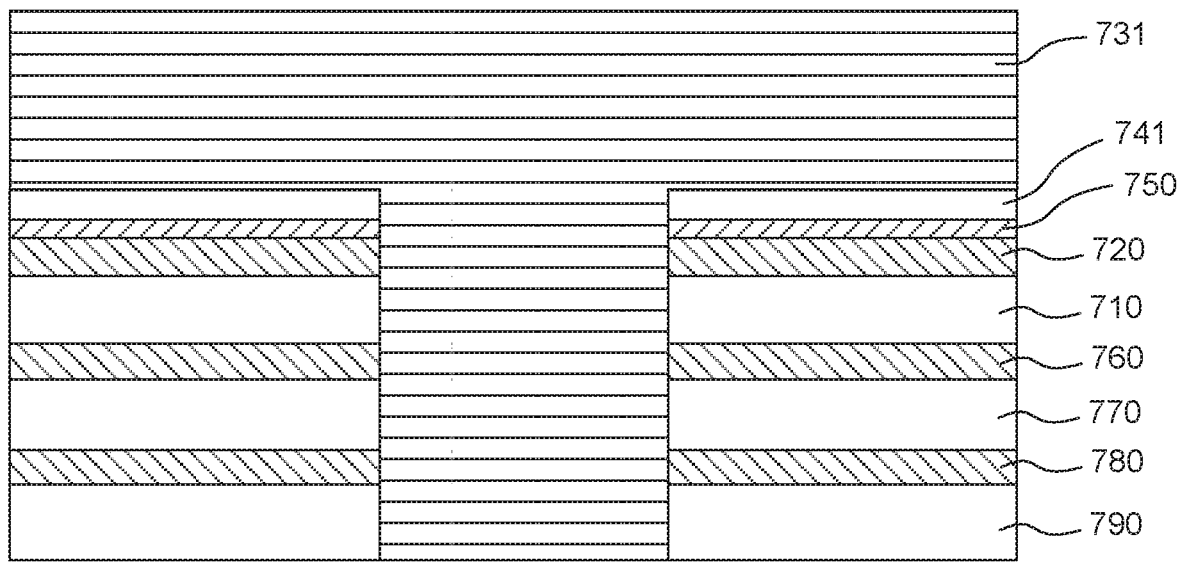

In FIG. 7B, a portion of the layers has been removed and filled with a nonconductive separator material 731 to form a via socket. The nonconductive separator material in this example is tetraethyl orthosilicate (TEOS).

Figure 7C:
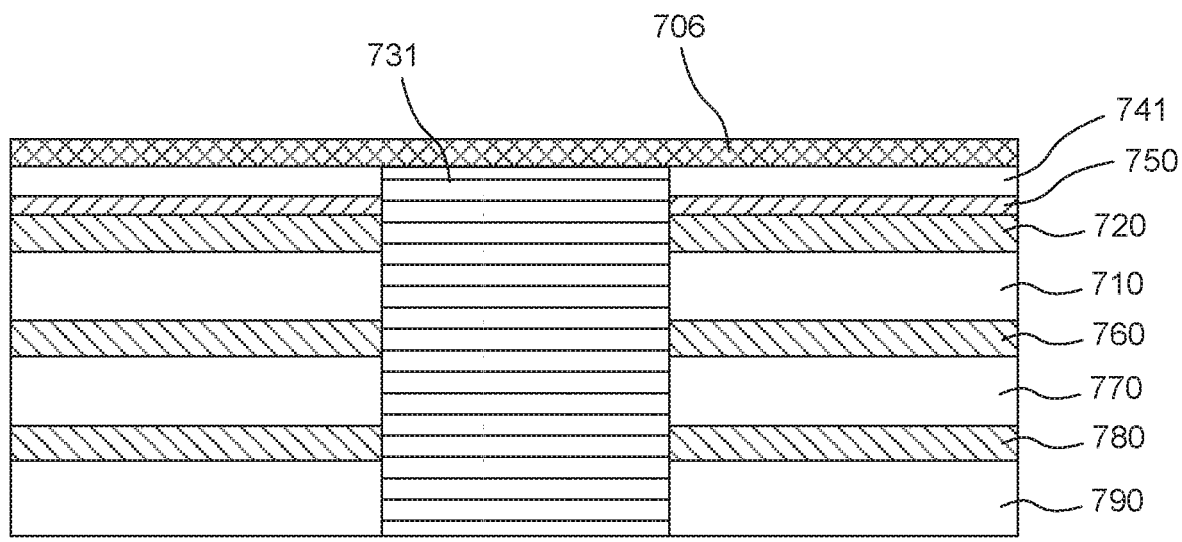

In FIG. 7C, a polishing operation has been used to remove excess TEOS 731 from the top of the stack and a nitride hardmask layer 706 has been deposited over the top of the partial tungsten layer 741 and the TEOS in the via socket.

Figure 7D:
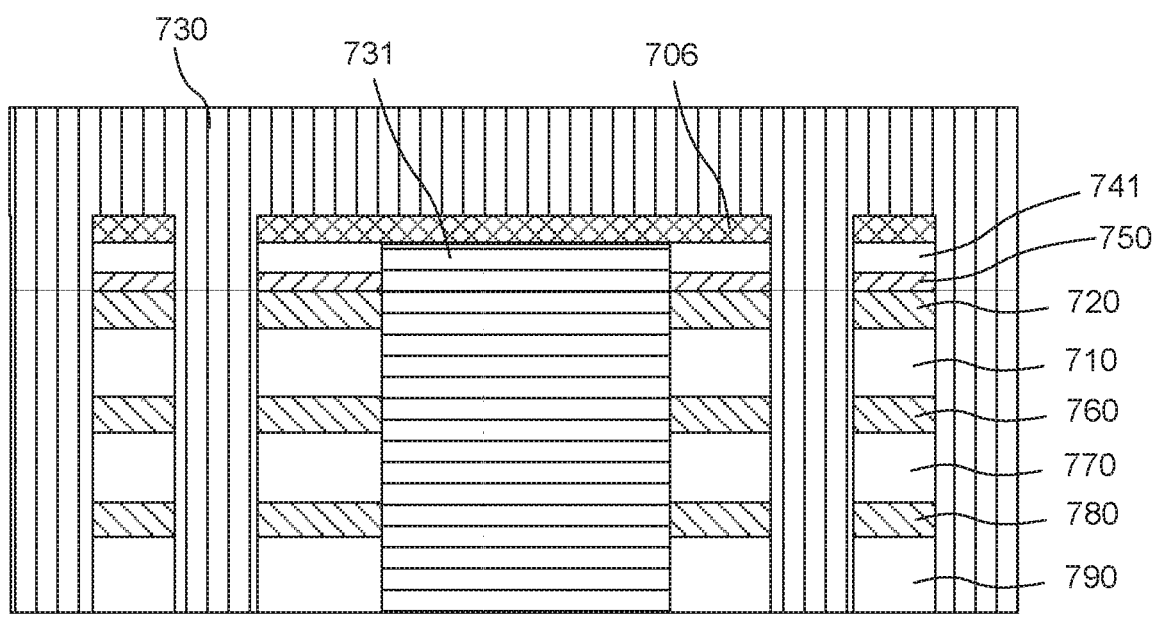

In FIG. 7D, the layers have been divided into multiple memory cells by etching areas of the stack between the memory cells to remove the layer materials and then filling the etched area with an additional nonconductive separator material 730. In this example, the additional nonconductive separator material is a carbon or carbon based spin-on dielectric.

Figure 7E:
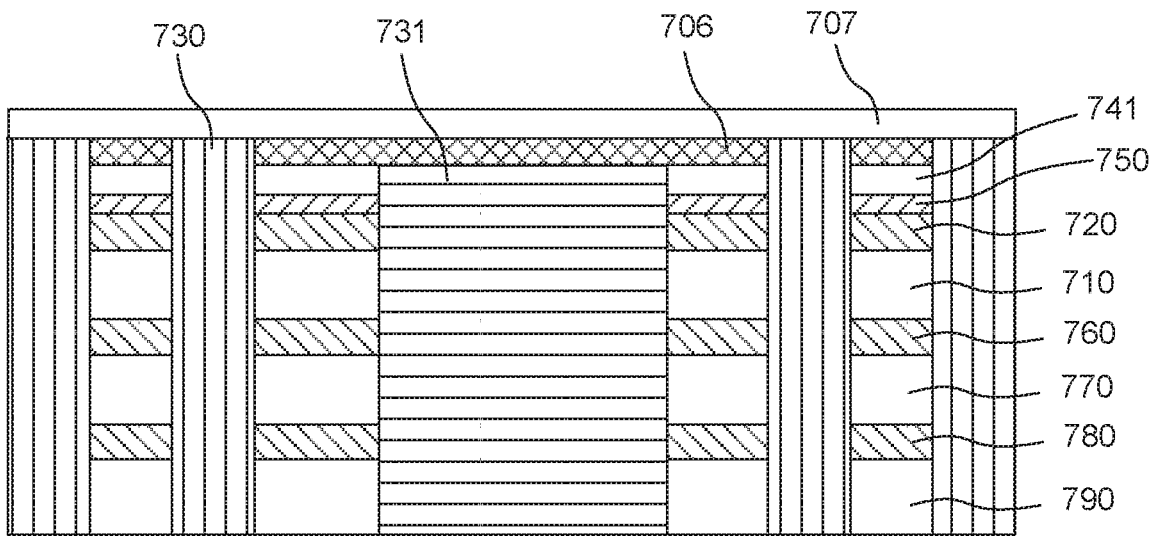

In FIG. 7E, excess carbon spin-on dielectric material has been removed by a polishing operation and a nitride cap 707 has been deposited over the layer stack.

Figure 7F:
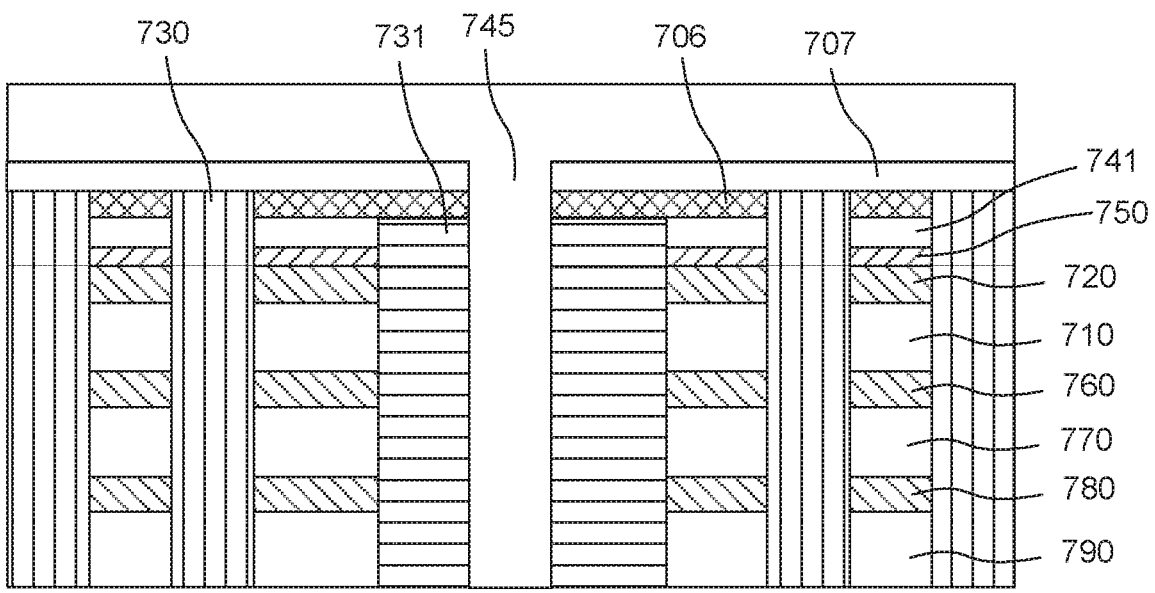

In FIG. 7F, an area of the TEOS 731 is etched and filled with tungsten to form a tungsten via 745.

Figure 7G:
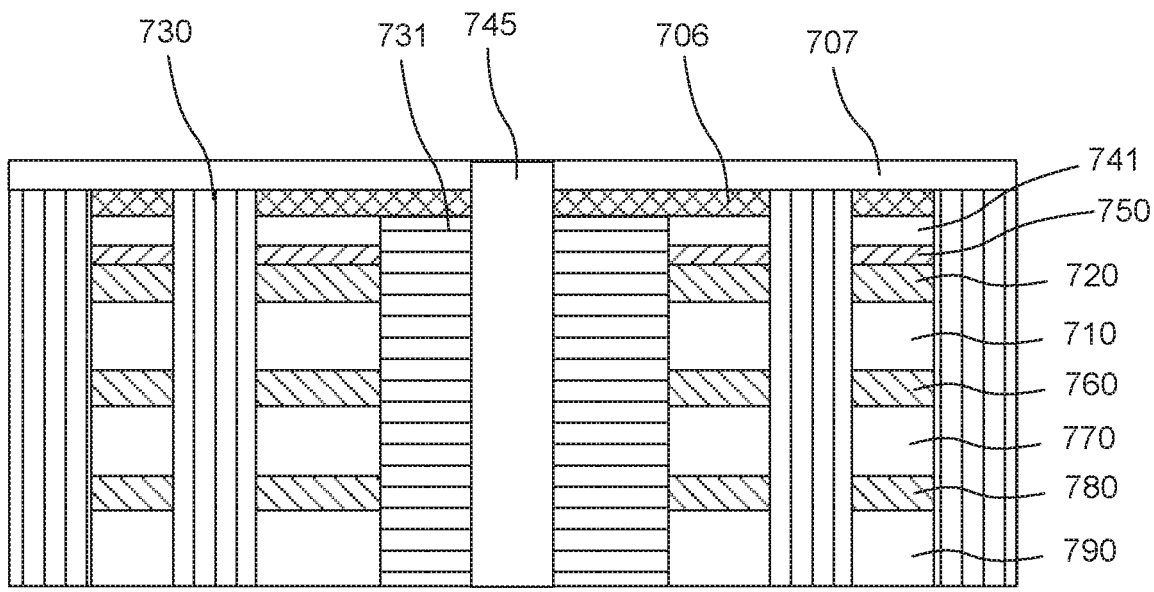

In FIG. 7G, the top portion of the tungsten is polished away by a chemical mechanical polishing operation designed to stop on the nitride cap.

Figure 7H:
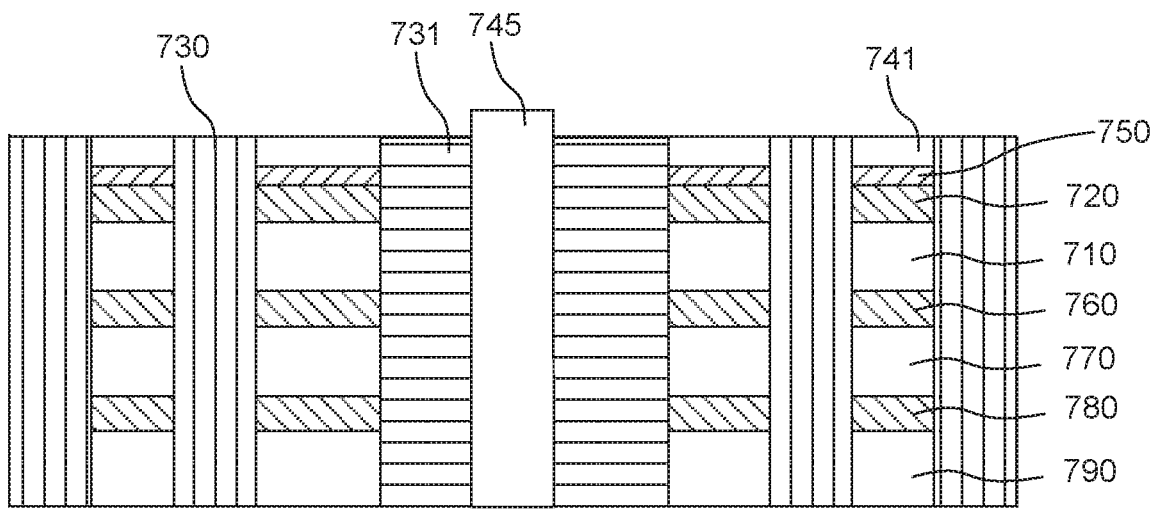

In FIG. 7H, the nitride cap is removed by a chemical mechanical polishing operation designed to stop on the tungsten layers at the tops of the memory cells.

Figure 7I:
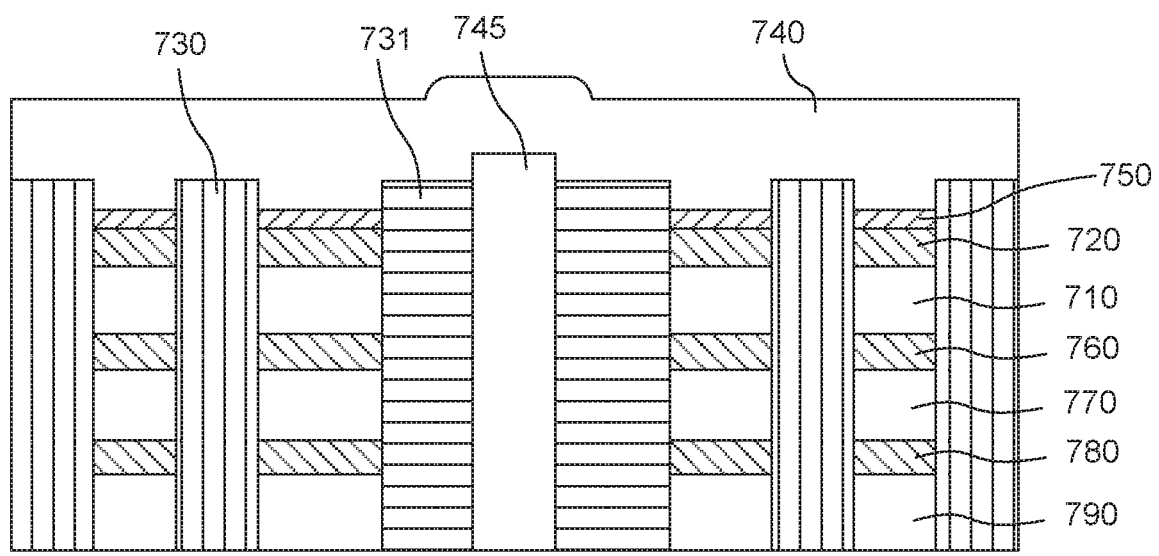

In FIG. 7I, additional tungsten is deposited to form a tungsten bit line 740. As described above, the additional tungsten together with the partial tungsten layers that were deposited earlier form a bit line with a non-flat bottom surface that protrudes down from the top surfaces (i.e., bit line end surfaces) of the spin-on dielectric material to the top surface of the tungsten silicon nitride layers.

In one example of the present technology, a memory cell includes a phase change material layer, a first electrode layer adjacent to the phase change material layer and having a phase change material layer side oriented toward the phase change material layer and a bit line side opposite the phase change material layer side, a metal silicon nitride layer on a surface of the bit line side of the first electrode layer opposite phase change material layer, and a nonconductive separator material having a bit line end and a word line end, and a portion contacting the phase change material layer. The bit line end surface of the nonconductive separator material is at least partially free of contact with the metal silicon nitride layer.

In another example, the bit line end surface of the nonconductive separator material extends farther away from the phase change material than a bit line side of the first electrode layer.

In yet another example, the bit line end surface of the nonconductive separator material extends farther away from the phase change material than a bit line side of the metal silicon nitride layer.

In a certain example, a height difference between the bit line end surface of the nonconductive separator material and the bit line side surface of the metal silicon nitride layer is from about 10 Å to about 500 Å.

In another example, the metal silicon nitride layer comprises tungsten silicon nitride, tantalum silicon nitride, niobium silicon nitride, molybdenum silicon nitride, titanium silicon nitride, or a combination thereof.

In a particular example, the metal silicon nitride layer has a thickness from about 10 Å to about 300 Å.

In another example, the memory cell further comprises a second electrode layer adjacent to the phase change material layer on a side opposite the first electrode layer, a select device layer adjacent to the second electrode layer on a side opposite the phase change material layer, and a third electrode layer adjacent to the select device layer on a side opposite the second electrode layer.

In yet another example, the nonconductive separator material comprises a spin-on dielectric material.

In still another example, the first electrode layer comprises a carbon-containing material.

In a certain example, the bit line side surface of the first electrode is substantially flat.

In another example, the phase change material layer comprises a chalcogenide.

In a further example, the bit line end surface of the nonconductive separator material is substantially free of contact with the metal silicon nitride layer.

In a still further example, the bit line end surface of the nonconductive separator material is free of contact with the metal silicon nitride layer.

Another example of the present technology includes a memory device. In one example, a memory device includes a plurality of memory cells, a first nonconductive separator material separating the memory cells and having a word line end and bit line end, a metal via separated from the plurality of memory cells by a second nonconductive separator material, and metal bit line electrically connecting the metal via with the plurality of memory cells. A bit line end surface of the first nonconductive separator material is at least partially free of contact with the metal silicon nitride.

In another example, the metal bit line comprises tungsten, tantalum, niobium, molybdenum, titanium, or a combination thereof.

In yet another example, the metal via comprises tungsten, tantalum, niobium, molybdenum, titanium, or a combination thereof.

In a particular example, the metal bit line and the metal via comprise substantially the same material.

In another example, no metal silicon nitride layer is present on a bit line oriented surface of the metal via, such that the metal bit line contacts the bit line oriented surface of the metal via by a metal-to-metal contact.

In some examples, the first nonconductive separator material comprises a spin-on dielectric material.

In a certain example, the second nonconductive separator material is tetraethyl orthosilicate (TEOS) or is formed from tetraethyl orthosilicate.

In a particular example, the first nonconductive separator material and the second nonconductive separator material are the same material.

In yet another example, the second nonconductive separator material has a bit line oriented surface with a height variation less than about 100 Å.

In another example, the metal bit line overlies the memory cells and the metal via and a surface of the metal bit line opposite the memory cells is less than about 50 Å higher at a location over the metal via compared to a location over the memory cells.

In yet another example, the bit line end surface of the first nonconductive separator material extends farther away from the phase change material than the bit line side surface of the first electrode layer.

In still another example, the bit line end surface of the first nonconductive separator material extends farther away from the phase change material than a bit line side surface of the metal silicon nitride layer.

In a certain example, a height difference between the bit line end surface of the first nonconductive separator material and the bit line side surface of the metal silicon nitride layer is from about 10 Å to about 500 Å.

In some examples, the metal silicon nitride layer comprises tungsten silicon nitride, tantalum silicon nitride, niobium silicon nitride, molybdenum silicon nitride, titanium silicon nitride, or a combination thereof.

In one example, the metal silicon nitride layer has a thickness from about 10 Å to about 300 Å.

In another example, the memory cells further comprise a second electrode layer adjacent to the phase change material layer on a side opposite the first electrode layer, a select device layer adjacent to the second electrode layer on a side opposite the phase change material layer, and a third electrode layer adjacent to the select device layer on a side opposite the second electrode layer.

In yet another example, the first electrode layer comprises a carbon-containing material.

In still another example, the bit line side surface of the first electrode is substantially flat.

In a certain example, the phase change material layer comprises a chalcogenide.

In another example, the bit line end surface of the first nonconductive separator material is substantially free of contact with metal silicon nitride.

In a particular example, the bit line end surface of the first nonconductive separator material is free of contact with metal silicon nitride.

Another exemplary embodiment of the present technology includes a computing system. The computing system comprises a motherboard and the memory device operatively coupled to the motherboard.

In further examples, the computing system comprises a desktop computer, a laptop computer, a tablet, a smartphone, a wearable device, a server, or a combination thereof.

In still further example, the computing system further comprises a processor, a memory device, a heat sink, a radio, a slot, a port, or a combination thereof operably coupled to the motherboard.

Another exemplary embodiment can include a memory device comprising a memory cell, a metal via, and a metal bit line connecting to a bit line side surface of the memory cell and a bit line oriented surface of the metal via. The memory cell comprises a phase change material layer, a first electrode layer adjacent to the phase change material layer and having a phase change material side oriented toward the phase change material and a bit line side opposite the phase change material side, a metal silicon nitride layer on a bit line side surface of the first electrode layer, and a first nonconductive separator material contacting the phase change material layer and having a bit line end and a word line end. The metal via is laterally contacted by a second nonconductive separator material. The second nonconductive separator material separates the metal via from the memory cell. The metal bit line contacts the via by a metal-to-metal contact.

In another example, the first nonconductive separator material has a bit line end surface that extends farther away from the phase change material than a bit line side surface of the metal silicon nitride layer.

In yet another example, the metal bit line has a surface that contacts the bit line end surface of the first nonconductive separator material and protrudes down from the bit line end surface of the first nonconductive separator material to the bit line side surface of the metal silicon nitride layer.

In a certain example, a height difference between the bit line end surface of the first nonconductive separator material and the bit line side surface of the metal silicon nitride layer is from about 10 Å to about 500 Å.

In another example, the second nonconductive separator material contacts one side of the phase change material layer and the first nonconductive separator material contacts the remaining sides of the phase change material layer.

In some examples, the metal bit line comprises tungsten, tantalum, niobium, molybdenum, titanium, or a combination thereof.

In further examples, the metal via comprises tungsten, tantalum, niobium, molybdenum, titanium, or a combination thereof.

In a certain example, the metal bit line and the metal via comprise the same material.

In further examples, the first nonconductive separator material comprises a spin-on dielectric material.

In another example, the second nonconductive separator material is tetraethyl orthosilicate (TEOS) or is formed from tetraethyl orthosilicate.

In a particular example, the first nonconductive separator material and the second nonconductive separator material are the same material.

In a certain example, the second nonconductive separator material has a bit line end surface with a height variation less than about 100 Å.

In another example, the metal bit line overlies the memory cell and the metal via and a surface of the metal bit line opposite the memory cell and metal via is less than about 50 Å higher at a location over the metal via compared to a location over the memory cell.

In some examples, the metal silicon nitride layer comprises tungsten silicon nitride, tantalum silicon nitride, niobium silicon nitride, molybdenum silicon nitride, titanium silicon nitride, or a combination thereof.

In a particular example, the metal silicon nitride layer has a thickness from about 10 Å to about 300 Å.

In another example, the memory cells further comprise a second electrode layer adjacent to the phase change material layer on a side opposite the first electrode, a select device layer adjacent to the second electrode layer on a side opposite the phase change material, and a third electrode layer adjacent to the select device layer on a side opposite the second electrode.

In a further example, the first electrode layer comprises a carbon-containing material.

In yet another example, the bit line side surface of the first electrode is substantially flat.

In still another example, the phase change material layer comprises a chalcogenide.

In another example, a computing system includes a motherboard and the memory device operatively coupled to the mother board.

In further examples, the computing system comprises a desktop computer, a laptop computer, a tablet, a smartphone, a wearable device, a server, or a combination thereof.

In still further examples, the computing system further comprises a processor, a memory device, a heat sink, a radio, a slot, a port, or a combination thereof operably coupled to the motherboard.

Another exemplary embodiment includes a method of manufacturing a memory device. The method comprises depositing a material layer stack including a phase change material layer, a first electrode layer on the phase change material layer, a metal silicon nitride layer in contact with the first electrode layer, and a metal layer in contact with the metal silicon nitride layer. A portion of the material layer stack is removed and the volume of the removed portion is filled with a nonconductive separator material to form a via socket. A second portion of the material layer stack is divided into a plurality of memory cells. A metal via is deposited in the via socket. The metal via is separated from the plurality of memory cells by the nonconductive separator material. A metal bit line is deposited in contact with the metal layer of the memory cells and the metal via.

In a particular example, the metal bit line has a thickness greater than a thickness of the metal layer of the memory cells.

In another example, depositing the material stack further includes depositing a third electrode layer, a select device layer over the third electrode layer and a second electrode layer over the select device before depositing the phase change material layer over the second electrode layer.

In a further example, dividing a second portion of the material layer stack into a plurality of memory cells comprises: applying a nitride mask layer over the material layer stack, etching an area of the second portion of the material layer stack to form the plurality of memory cells, and filling the etched area with an additional nonconductive separator material.

In yet another example, the method further comprises removing the nitride mask layer using a chemical mechanical polishing operation that stops on the bit line end surface of the metal layer of the memory cells leaving a bit line end surface of the additional nonconductive separator material coplanar with the bit line end surface of the metal layer.

In a particular example, the metal via extends past the nonconductive separator material of the via socket by a distance from about 10 Å to about 50 Å immediately after the chemical mechanical polishing operation.

In another example, the via socket is formed before dividing a second portion of the material layer stack into a plurality of memory cells, and wherein the metal via is deposited in the via socket after dividing a second portion of the material layer stack into a plurality of memory cells.

In some examples, the metal bit line comprises tungsten, tantalum, niobium, molybdenum, titanium, or a combination thereof.

In other examples, the metal via comprises tungsten, tantalum, niobium, molybdenum, titanium, or a combination thereof.

In a certain example, the metal bit line and the metal via comprise the same material.

In further examples, the additional nonconductive separator material separating the memory cells comprises a spin-on dielectric material.

In another example, the nonconductive separator material of the via socket is tetraethyl orthosilicate (TEOS) or is formed from tetraethyl orthosilicate.

In a particular example, the nonconductive separator material of the via socket and the additional nonconductive separator material separating the memory cells are the same material.

In yet another example, the metal bit line connects to the metal via and to the metal layers of the memory cells by a metal-to-metal contact.

In other examples, the metal silicon nitride layer comprises tungsten silicon nitride, tantalum silicon nitride, niobium silicon nitride, molybdenum silicon nitride, titanium silicon nitride, or a combination thereof.

In a certain example, the metal silicon nitride layer has a thickness from about 10 Å to 300 Å.

In another example, the metal layer has a thickness from about 50 Å to about 500 Å.

In yet another example, the first electrode layer comprises a carbon-containing material.

In still another example, the phase change material layer comprises a chalcogenide.

While the forgoing examples are illustrative of the principles of embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory device, comprising:
   a plurality of memory cells comprising a phase change material layer, a first electrode layer adjacent to the phase change material layer and having a phase change material side oriented toward the phase change material layer and a bit line side opposite the phase change material side, and a metal silicon nitride layer on a bit line side surface of the first electrode layer;
   a first nonconductive separator material separating the plurality of memory cells and having a word line end and a bit line end, wherein a bit line end surface of the first nonconductive separator material extends, relative to a bit line side surface of the metal silicon nitride layer, further away from the bit line side of the first electrode layer;
   a second nonconductive separator material extending through the first electrode layer and the metal silicon nitride layer;
   a metal via separated from the plurality of memory cells by the second nonconductive separator material; and
   a metal bit line electrically connecting the metal via with the plurality of memory cells, wherein a bit line oriented surface of the metal via extends, relative to the bit line side surface of the metal silicon nitride layer, further away from the bit line side of the first electrode layer, wherein the first and second nonconductive separator materials and the metal via protrude into and not through the metal bit line, and wherein the metal bit line overlies the plurality of memory cells and the metal via, and wherein a top surface of the metal bit line at a location over the metal via protrudes in a direction facing away from the metal via as compared to a top surface of the metal bit line at a location over the plurality of memory cells.

2. The memory device of claim 1, wherein the metal bit line and the metal via comprise substantially the same material.

3. The memory device of claim 1, wherein the metal bit line contacts the bit line oriented surface of the metal via by a metal-to-metal contact.

4. The memory device of claim 1, wherein the first nonconductive separator material and the second nonconductive separator material comprise the same material.

5. The memory device of claim 1, wherein the second nonconductive separator material has a bit line oriented surface with a height variation less than about 100 Å.

6. The memory device of claim 1, via and wherein the top surface of the metal bit line opposite the memory cells extends less than about 50 Å further away from the memory cells at the location over the metal via compared to the location over the memory cells.

7. The memory device of claim 1, wherein the bit line end surface of the first nonconductive separator material extends further away from the phase change material layer than the bit line side surface of the first electrode layer.

8. The memory device of claim 1, wherein the bit line end surface of the first nonconductive separator material extends further away from the phase change material layer than the bit line side surface of the metal silicon nitride layer.

9. The memory device of claim 1, wherein a height difference between the bit line end surface of the first nonconductive separator material and the bit line side surface of the metal silicon nitride layer is from about 10 Å to about 500 Å.

10. The memory device of claim 1, wherein the metal silicon nitride layer has a thickness from about 10 Å to about 300 Å.

11. The memory device of claim 1, wherein the memory cells further comprise a second electrode layer adjacent to the phase change material layer on a side of the phase change material layer opposite the first electrode layer, a select device layer adjacent to the second electrode layer on a side of the second electrode layer opposite the first electrode layer, and a third electrode layer adjacent to the select device layer on a side of the select device layer opposite the second electrode layer.

12. The memory device of claim 1, wherein the first electrode layer comprises a carbon-containing material.

13. The memory device of claim 12, wherein the bit line side surface of the first electrode layer is substantially flat.

14. The memory device of claim 1, wherein the bit line end surface of the first nonconductive separator material is substantially free of contact with the metal silicon nitride layer.

* * * * *